(12) United States Patent  
Jin et al.

(10) Patent No.: US 10,014,490 B2  
(45) Date of Patent: Jul. 3, 2018

(54) FLEXIBLE DISPLAY PANEL, FABRICATION METHOD, AND FLEXIBLE DISPLAY APPARATUS

(71) Applicants: Shanghai Tianma AM-OLED Co., Ltd., Shanghai (CN); Tianma Micro-Electronics Co., Ltd., Shenzhen (CN)

(72) Inventors: Jian Jin, Shanghai (CN); Congyi Su, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/868,532

(22) Filed: Jan. 11, 2018

(65) Prior Publication Data

US 2018/0138448 A1    May 17, 2018

Related U.S. Application Data

(63) Continuation of application No. 15/497,792, filed on Apr. 26, 2017, now Pat. No. 9,929,374.

(30) Foreign Application Priority Data

Dec. 28, 2016 (CN) .......................... 2016 1 1238279

(51) Int. Cl.
- *H01L 51/52* (2006.01)
- *H01L 51/56* (2006.01)
- *H01L 51/00* (2006.01)

(52) U.S. Cl.
CPC ...... *H01L 51/5246* (2013.01); *H01L 51/0097* (2013.01); *H01L 51/56* (2013.01); *H01L 2251/5338* (2013.01)

(58) Field of Classification Search
CPC ................... H01L 51/0097; H01L 2251/5338
See application file for complete search history.

(56) References Cited

U.S. PATENT DOCUMENTS

2015/0102298 A1* 4/2015 Namkung ........... H01L 51/0097
257/40

FOREIGN PATENT DOCUMENTS

| CN | 104183620 A | 12/2014 |
| CN | 104659062 A | 5/2015 |
| CN | 104885140 A | 9/2015 |

\* cited by examiner

*Primary Examiner* — Daniel Shook  
(74) *Attorney, Agent, or Firm* — Anova Law Group, PLLC

(57) ABSTRACT

A flexible display panel and a flexible display apparatus are provided. The flexible display panel comprises a flexible substrate, an organic light-emitting layer disposed on a side of the flexible substrate and having a first side facing the flexible substrate and an opposing side, and a thin-film-encapsulation layer disposed on the opposing side of the organic light-emitting layer and including at least one organic encapsulation layer and at least one inorganic encapsulation layer. The flexible display panel includes at least one bending area. The at least one organic encapsulation layer has a first side facing the flexible substrate and an opposing side. In the at least one bending area, at least one groove is formed on the opposing side of the at least one organic encapsulation layer. A bottom width W of the at least one groove is configured to be $$W \geq \frac{n}{180°}\pi R.$$

26 Claims, 10 Drawing Sheets

FLEXIBLE DISPLAY PANEL, FABRICATION METHOD, AND FLEXIBLE DISPLAY APPARATUS

CROSS-REFERENCES TO RELATED APPLICATIONS

This application is a continuation application of U.S. patent application Ser. No. 15/497,792, filed on Apr. 26, 2017, which claims the priority of Chinese Patent Application No. CN201611238279.2, filed on Dec. 28, 2016, the entire contents of which are incorporated herein by reference.

FIELD OF THE DISCLOSURE

The present disclosure generally relates to the display technology and, more particularly, relates to a flexible display panel, a fabrication method for the flexible display panel, and a flexible display apparatus.

BACKGROUND

Emerging flexible display technology has gained a lot of attention. When bending an existing flexible display panel, due to the thickness of the flexible display panel, a substantially large bending stress is generated in the flexible display panel. The substantially large bending stress easily causes cracks or even breakage in the bending area of the display panel.

The disclosed flexible display panel, fabrication method for the flexible display panel, and flexible display apparatus are directed to solve one or more problems set forth above and other problems.

BRIEF SUMMARY OF THE DISCLOSURE

One aspect of the present disclosure provides a flexible display panel. The flexible display panel comprises a flexible substrate, an organic light-emitting layer disposed on a side of the flexible substrate and having a first side facing the flexible substrate and an opposing side, and a thin-film-encapsulation layer disposed on the opposing side of the organic light-emitting layer and including at least one organic encapsulation layer and at least one inorganic encapsulation layer. The flexible display panel includes at least one bending area. The at least one organic encapsulation layer has a first side facing the flexible substrate and an opposing side. The at least one inorganic encapsulation layer has a first side facing the flexible substrate and an opposing side. In the at least one bending area, at least one groove is formed on the opposing side of the at least one organic encapsulation layer. A bottom width W of the at least one groove is configured to be $$W \geq \frac{n}{180°}\pi R,$$

a maximum bending angle of the at least one bending area, $0° < n \leq 180°$, and R is a bending radius of the at least one bending area.

Another aspect of the present disclosure provides a flexible display apparatus comprising the disclosed flexible display panel.

Another aspect of the present disclosure provides a fabrication method for the flexible display panel. The fabrication method comprises providing a flexible substrate, forming an organic light-emitting layer having a first side facing the flexible substrate and an opposing side on a side of the flexible substrate, and forming a thin-film-encapsulation layer on the opposing side of the organic light-emitting layer. The thin-film-encapsulation layer includes at least one organic encapsulation layer and at least one inorganic encapsulation layer. The flexible display panel includes at least one bending area. At least one groove is formed on the opposing side of the at least one organic encapsulation layer in the at least one bending area. A bottom width W of the at least one groove is configured to be $$W \geq \frac{n}{180°}\pi R,$$

where n is a maximum bending angle of the at least one bending area, $0° < n \leq 180°$, and R is a bending radius of the at least one bending area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. All other embodiments obtained by those skilled in the art without making creative work are within the scope of the present invention.

The present disclosure will now be described in detail with reference to the accompanying drawings. When illustrating the embodiments of the present disclosure, certain areas of the schematic views of the device structures may be disproportionally enlarged for the convenience of illustration. In addition, the three-dimensional sizes including the length, width, and depth should be included in the actual implementation of the present disclosure.

Figure 1A:
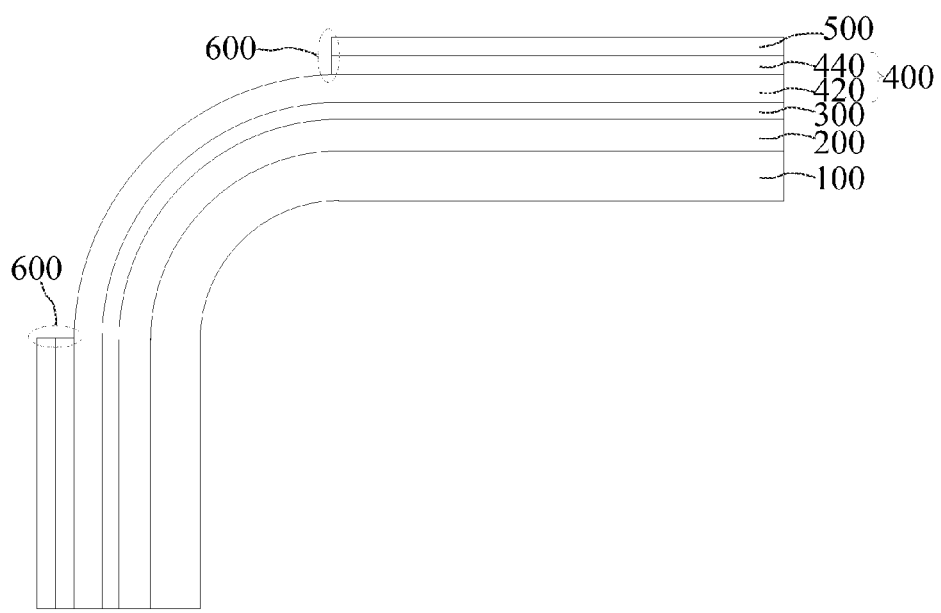
FIG. 1A illustrates a cross-sectional view of an existing display panel.

FIG. 1A illustrates a cross-sectional view of an existing display panel. As shown in FIG. 1, the existing display panel often includes a substrate 100, a thin-film-transistor layer 200 disposed on the substrate 100, an organic light-emitting layer 300 disposed on the thin-film-transistor layer 200, a thin-film-encapsulation layer 400 disposed on the organic light-emitting layer 300, a polarization layer 500 disposed on the thin-film-encapsulation layer 400, and a coverage window disposed on the polarization layer 500.

The thin-film-encapsulation layer 400 includes a first encapsulation sub-layer 420 and a second encapsulation sub-layer 440. The first encapsulation sub-layer 420 is formed by an organic insulation material. The second encapsulation sub-layer 440 is formed by a resin material. A portion of the second encapsulation sub-layer 440 in a bending area is removed for reducing the bending stress. However, when bending the flexible display panel, the bending stress tends to concentrate in the areas 600 and, thus, the bending stress in the bending area may not be effectively reduced. Further, the removal of the portion of the second encapsulation sub-layer 440 in the bending area may significantly degrade the encapsulation of the thin-film-encapsulation layer 400.

The present disclosure provides an improved flexible display panel. The flexible display panel may comprise a flexible substrate, an organic light-emitting layer disposed on a side of the flexible substrate and having a first side facing the flexible substrate and an opposing side, and a thin-film-encapsulation layer disposed on the opposing side of the organic light-emitting layer. The thin-film-encapsulation layer may include at least one organic encapsulation layer and at least one inorganic encapsulation layer. The organic encapsulation layer may have a first side facing the organic light-emitting layer and an opposing side. The flexible display panel may include at least one bending area, where at least one groove may be formed on the opposing side of at least one organic encapsulation layer. A width W at the bottom (i.e., the bottom width) of the groove may be configured to be $$W \geq \frac{n}{180°}\pi R,$$

where n is a maximum bending angle of the bending area, 0°<n≤180°, and R is a bending radius of the bending area.

Figure 1B:
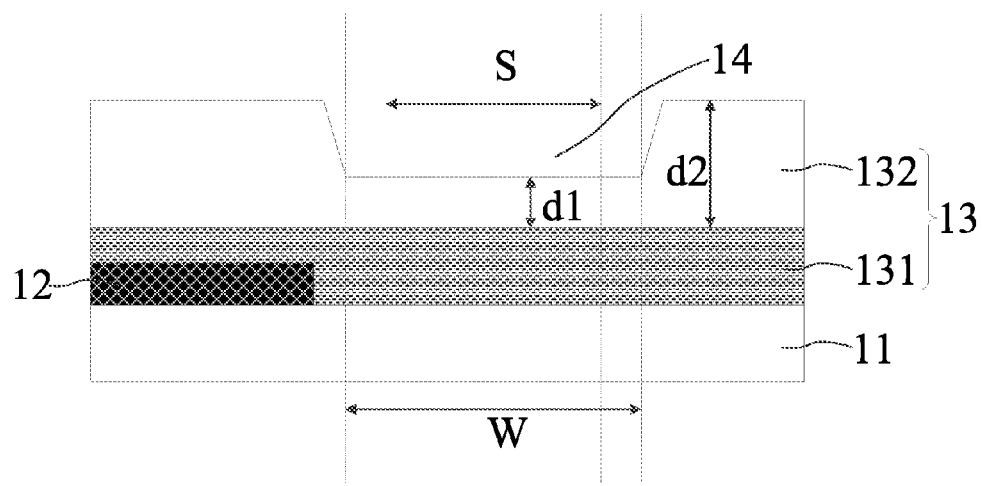
FIG. 1B illustrates a cross-sectional view of an exemplary flexible display panel according to the disclosed embodiments.

FIG. 1B illustrates a cross-sectional view of an exemplary flexible display panel according to the disclosed embodiments. As shown in FIG. 1B, the flexible display panel may include a flexible substrate 11, an organic light-emitting layer 12 disposed on a side of the flexible substrate 11 and having a first side facing the flexible substrate and an opposing side, and a thin-film-encapsulation layer 13 disposed on the opposing side of the organic light-emitting layer 12. The thin-film-encapsulation layer 13 may include an inorganic encapsulation layer 131 and an organic encapsulation layer 132. The organic encapsulation layer 132 may have a first side facing the organic light-emitting layer 12 and an opposing side.

The flexible display panel may include at least one bending area S. The organic encapsulation layer 132 in the bending area S may be formed with at least one groove 14 on the opposing side. The bottom width W of the groove 14 may be configured to be $$W \geq \frac{n}{180°}\pi R,$$

where n is a maximum bending angle of the bending area, 0°<n≤180°, and R is a bending radius of the bending area.

In the disclosed embodiments, because at least one organic encapsulation layer in the bending area S may be formed with at least one groove 14 on the opposing side, the thickness of the flexible display panel at the bending area S may be reduced and, accordingly, the bending stress generated in the bending area S of the flexible display panel may be reduced. Moreover, when the bottom width W of the groove 14 is configured to be $$W \geq \frac{n}{180°}\pi R,$$

the bending stress generated in the bending area S of the flexible display panel may not concentrate at the groove 14, the intensity of the bending stress may be reduced, and certain portion of the bending stress in the groove 14 may be relieved.

In addition, the disclosed flexible display panel may reduce the bending stress by reducing the thickness of certain sub-layers of the thin-film-encapsulation layer, instead of completely removing certain sub-layers of the thin-film-encapsulation layer in the existing flexible display panel. Thus, the bending stress in the bending area may still be effectively reduced and, meanwhile, ambient moisture and oxygen may be effectively prevented from entering the organic light-emitting layer through the thin-film-encapsulation layer, thereby ensuring the encapsulation of the thin-film-encapsulation layer.

As shown in FIG. 1B, the thin-film-encapsulation layer 13 may include one inorganic encapsulation layer 131 and one organic encapsulation layer 132, which is for illustrative purposes and is not intended to limit the scope of the present disclosure. In another embodiment, the number of the inorganic encapsulation layers and the number of the organic encapsulation layers each may be configured to be greater than 1.

Referring to FIG. 1B, the organic light-emitting layer 12 may include a plurality of organic light-emitting devices arranged in array. The organic light-emitting device may include any appropriate organic light-emitting devices. In one embodiment, the organic light-emitting device may include a first electrode, an organic light-emitting layer, and a second electrode, which are stacked sequentially. A thin-film-transistor layer may be disposed between the organic light-emitting layer 12 and the flexible substrate 11. The thin-film-transistor layer may include a plurality of thin-film-transistors, storage capacitors, data lines, gate lines, power supply voltage lines, and ground lines, etc.

The thin-film-encapsulation layer 13 may be configured to encapsulate the organic light-emitting device and the thin-film-transistors. The thin-film-encapsulation layer 13 may prevent ambient moisture and oxygen from entering the organic light-emitting devices, thereby protecting the organic light-emitting devices. The thin-film-encapsulation layer 13 may also protect the thin-film-transistors.

In one embodiment, the organic encapsulation layer 132 may be made of any one of acrylic, epoxy, and silicone material. The organic encapsulation layer 132 may be formed by an ink jet printing process. The ink jet printing is simple and reliable, through which the organic encapsulation layer 132 may be formed without masks. The inorganic encapsulation layer 131 may be formed by a chemical vapor deposition (CVD) or atomic layer deposition (ALD) process.

Figure 1C:
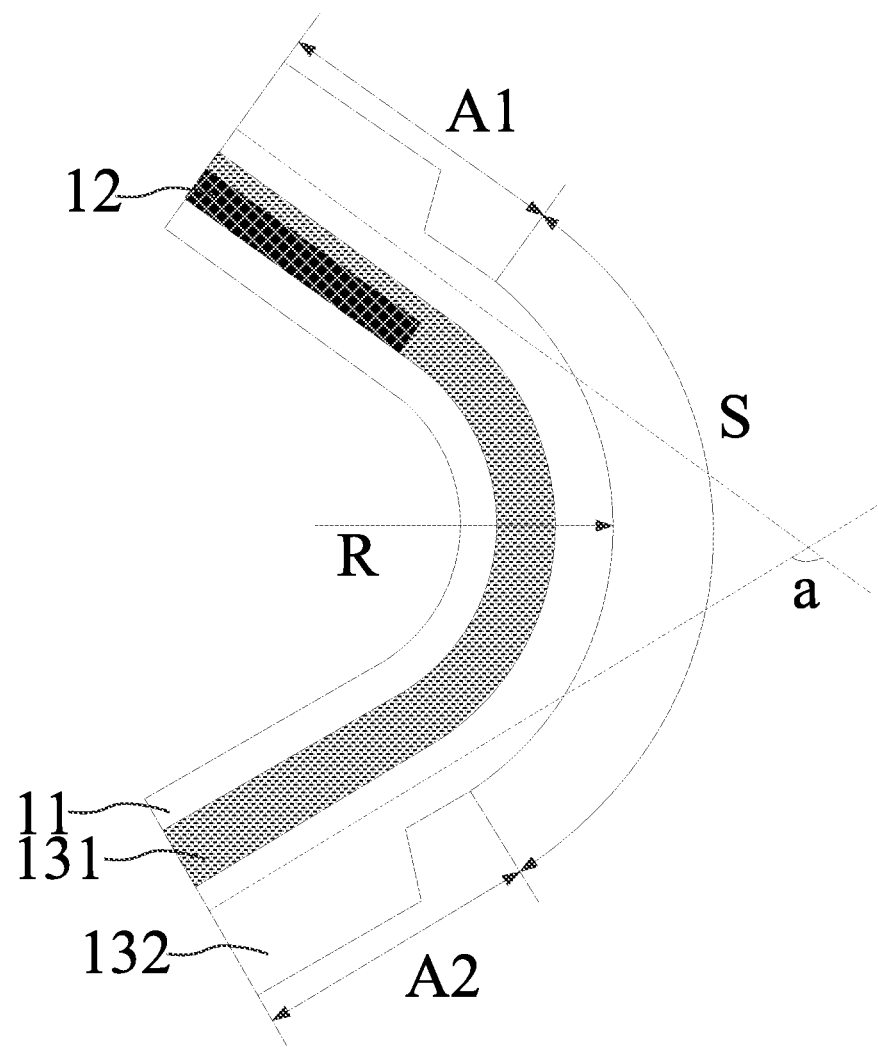
FIG. 1C illustrates a cross-sectional view of an exemplary bent flexible display panel according to the disclosed embodiments.

FIG. 1C illustrates a cross-sectional view of an exemplary bent flexible display panel according to the disclosed embodiments. As shown in FIG. 1C, the flexible display panel may include three areas, a first area A1, a bending area S, and a second area A2. The bending area S may be located between the first area A1 and the second area A2, and may be adjacent to and in contact with the first area A1 and the second area A2. That is, the first area A1 and the second area A2 may be extension areas on both sides of the bending area S.

A bending angle of the bending area S may be defined as a bending angle α of the second area A2 with respect to the first area A1. The bending radius R may be defined as a shortest distance between a center of the circle formed by the bending area S and the bottom of the groove 14. The bending R radius may be greater than or equal to about 0.1 mm. When the bending radius R is smaller than 0.1 mm, the flexible display panel may not be bent easily. Excessive bending stress may occur in the bending area S, thereby increasing the risk of the flexible display panel breakage. When the bending radius R is greater than or equal to 0.1 mm, the bending stress in the bending area S may be substantially small, thereby reducing the risk of the flexible display panel breakage.

Figure 1D:
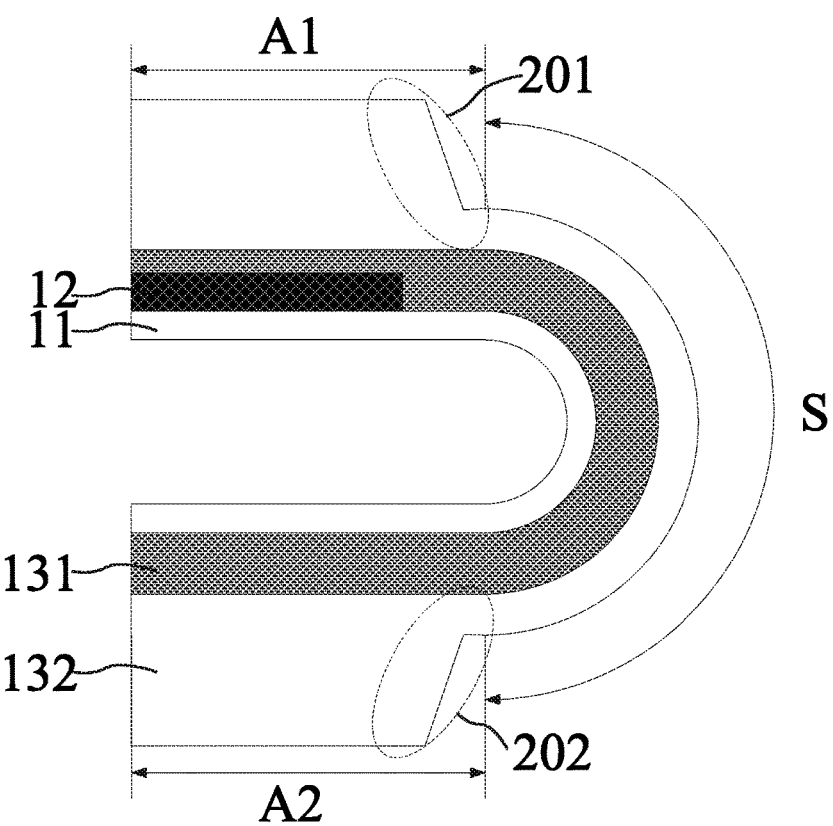
FIG. 1D illustrates a cross-sectional view of another exemplary bent flexible display panel according to the disclosed embodiments.

FIG. 1D illustrates a cross-sectional view of another exemplary bent flexible display panel according to the disclosed embodiments. As shown in FIG. 1D, the flexible display panel may be bent to a position having a bending angle of about 180° of the bending area S. Because the groove 14 is formed on the organic encapsulation layer 132 and is corresponding to the bending area S, the thickness of the flexible display panel in the bending area S may be reduced, and the bending stress in the bending area S of the flexible display panel may be reduced.

In addition, because the bottom width W of the groove 14 is configured to be $$W \geq \frac{n}{180°} \pi R,$$

i.e., W≥πR and a first climbing position 201 and a second climbing position 202 may be located just outside the bending area S, the bending stress in the bending area S may not concentrate at the first climbing position 201 and the second climbing position of the groove 14. Thus, the organic encapsulation layer 132 may be prevented from cracking or breaking at the first climbing position 201 and the second climbing position 202.

The organic encapsulation layer 132 may be disposed in the bending area S. The organic encapsulation layer 132 and the inorganic encapsulation layer 131 disposed in the bending area S may be coordinated to effectively block ambient moisture and oxygen, thereby reducing the bending stress in the bending area S and, meanwhile, ensuring the effective encapsulation of the thin-film-encapsulation layer 13 in the bending area S.

Further, in one embodiment, the width of the bottom of the groove 14 may be configured to W=πR. Because the groove 14 is formed in the bending area S, when the bottom width of the groove 14 is configured to be W=πR, the bottom width of the groove 14 may be equal to a width of the bending area S, thereby reducing the bending stress in the bending area S and, meanwhile, ensuring the effective encapsulation of the thin-film-encapsulation layer 13.

Returning to FIG. 1B, in one embodiment, the organic encapsulation layer 132 formed with the groove 14 may have a thickness d2 of approximately between 2 μm and 40 μm, and the groove 14 may have a thickness d1 of approximately between 1 μm and 20 μm. The organic encapsulation layer 132 may relieve the bending stress generated between the inorganic encapsulation layers 131 and increase invasion paths of moisture and oxygen. However, when the organic encapsulation layer 132 is substantially thick, the neutral plane may be deviated from the organic light-emitting layer 12, damaging the organic light-emitting layer 12 when bending the flexible display panel, and degrading display performance. In addition, when the organic encapsulation layer 132 is substantially thick, the bending radius may increase. Thus, the organic encapsulation layer 132 formed with the groove 14 may be configured to have the thickness d2 of approximately between 2 μm and 40 μm, and the groove 14 may be configured to have the thickness d1 of approximately between 1 μm and 20 μm.

Figure 2A:
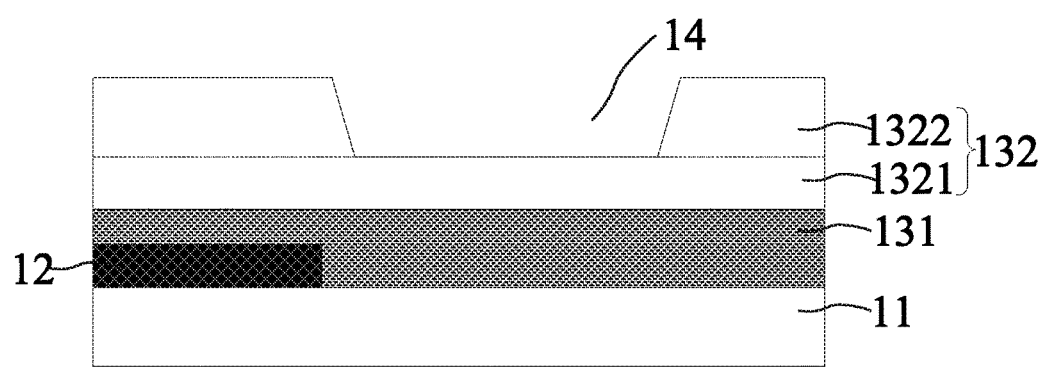
FIG. 2A illustrates a cross-sectional view of another exemplary flexible display panel according to the disclosed embodiments.

FIG. 2A illustrates a cross-sectional view of another exemplary flexible display panel according to the disclosed embodiments. The similarities between FIG. 2A and FIG. 1B are not repeated here, while certain differences will be explained.

As shown in FIG. 2A, the organic encapsulation layer 132 may further include a first organic encapsulation sub-layer 1321 and a second organic encapsulation sub-layer 1322. The first organic encapsulation sub-layer 1321 may be continuously disposed to cover the entire flexible display panel. The second organic encapsulation sub-layer 1322 may be discontinued in the bending area S, thereby forming at least one groove 14.

Figure 2B:
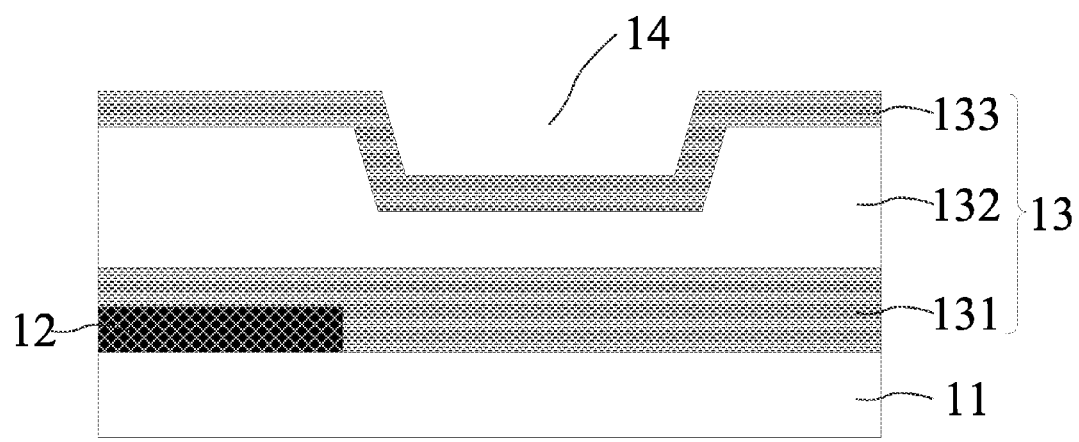
FIG. 2B illustrates a cross-sectional view of another exemplary flexible display panel according to the disclosed embodiments.

FIG. 2B illustrates a cross-sectional view of another exemplary flexible display panel according to the disclosed embodiments. In another embodiment, as shown in FIG. 2B, the flexible display panel may include a flexible substrate 11, an organic light-emitting layer 12 disposed on a side of the flexible substrate 11 and having a first side facing the flexible substrate and an opposing side, a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132 disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be formed with at least one groove 14 in the bending area S.

The first inorganic encapsulation layer 131 and the second inorganic encapsulation layer 133 may easily have cracks when being bent, due to the material properties of inorganic encapsulation layers. Through configuring the first organic encapsulation layer 132 to have at least one groove 14 formed in the bending area S, the bending stress may be reduced. Accordingly, the second inorganic encapsulation layer 133 disposed on the first organic encapsulation layer 132 may be prevented from cracking or breaking caused by excessive bending stress when being bent, and the encapsulation effectiveness of the thin-film-encapsulation layer 13 may be ensured.

Figure 2C:
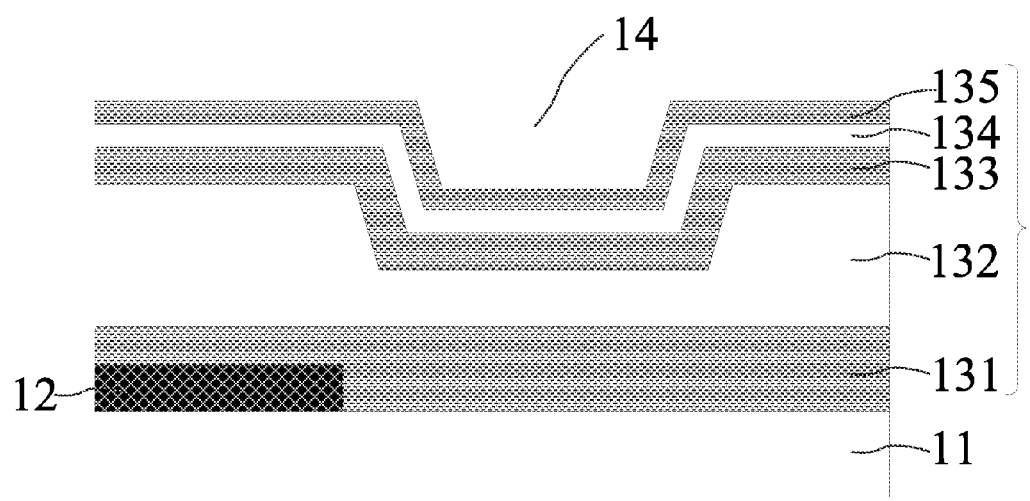
FIG. 2C illustrates a cross-sectional view of another exemplary flexible display panel according to the disclosed embodiments.

FIG. 2C illustrates a cross-sectional view of another exemplary flexible display panel according to the disclosed embodiments. The similarities between FIG. 2C and FIG. 1B are not repeated here, while certain differences will be explained.

As shown in FIG. 2C, the flexible display panel may include a flexible substrate 11, an organic light-emitting layer 12 disposed on a side of the flexible substrate 11 and having a first side facing the flexible substrate and an opposing side, a thin-film-encapsulation layer 13 disposed on the opposing side of the organic light-emitting layer 12. The thin-film-encapsulation layer 13 may include a first inorganic encapsulation layer 131, a first organic encapsulation layer 132, a second inorganic encapsulation layer 133, a second organic encapsulation layer 134, and a third inorganic encapsulation layer 135.

Either the first organic encapsulation layer 132 or the second organic encapsulation layer 134 may be configured with at least one groove 14 in the bending area S, such that the bending stress may be reduced, and at least one of the second inorganic encapsulation layer 133 disposed on the first organic encapsulation layer 132 and the third inorganic encapsulation layer 135 disposed on the second organic encapsulation layer 134 may be prevented from cracking or breaking caused by an excessive bending stress when being bent. Employing three inorganic encapsulation layers and two organic encapsulation layers may ensure the encapsulation effectiveness of the thin-film-encapsulation layer 13, and may improve the life span of the flexible display panel.

Figure 3A:
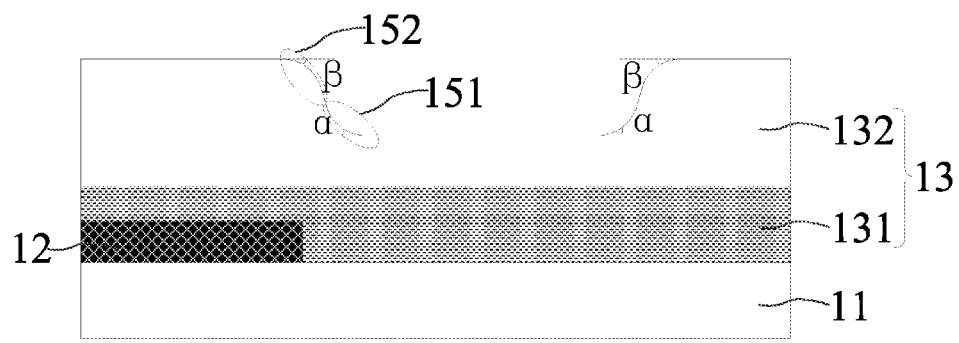
FIG. 3A illustrates a cross-sectional view of another exemplary flexible display panel according to the disclosed embodiments.

FIG. 3A illustrates a cross-sectional view of another exemplary flexible display panel according to the disclosed embodiments. The similarities between FIG. 3A and FIG. 1B are not repeated here, while certain differences will be explained.

As shown in FIG. 3A, the flexible display panel may further include at least one of a first curved line 151 and a second curved line 152. The first curved line 151 may be disposed transitioning between the bottom of the groove 14 and the side wall of the groove 14, and the second curved line 152 may be disposed transitioning between the side wall of the groove 14 and the non-recessed surface of the organic encapsulation layer 132.

The transition between the bottom of the groove 14 and the side wall of the groove 14 may be smoothed through the first curved line 151. When being bent, the bending stress at the bottom and on the side wall of the groove 14 may be further reduced. Thus, the risk of cracks in the organic encapsulation layer 132 may be further reduced, and the bending performance of the flexible display panel when being bent may be improved.

An angle $\alpha$ formed between the first curved line 151 and the bottom of the groove 14 may be determined according to various application scenarios. In one embodiment, the angle $\alpha$ formed between the first curved line 151 and the bottom of the groove 14 may be greater than about 0° and smaller than or equal to about 70°, i.e., $0°<\alpha\leq70°$. In another embodiment, the angle $\alpha$ formed between the first curved line 151 and the bottom of the groove 14 may be greater than about 15° and smaller than or equal to about 70°, i.e., $15°<\alpha\leq70°$. When the angle $\alpha$ formed between the first curved line 151 and the bottom of the groove 14 is large, for example, greater than about 70° and smaller than or equal to about 90°, a substantially large bending stress may be generated when the flexible display panel is bent. The bending stress may likely concentrate in the groove 14, thereby causing the groove 14 to crack or break.

When the angle $\alpha$ formed between the first curved line 151 and the bottom of the groove 14 is sustainably small, the bottom width of the groove 14 may be sustainably wide, and the groove 14 may extend into the display area of the flexible display panel, thereby causing the light emitted from the display area to refract and reflect, and degrading the display performance of the flexible display panel. Thus, the angle $\alpha$ formed between the first curved line 151 and the bottom of the groove 14 may be configured to be greater than about 15° and smaller than or equal to about 70°, i.e., $15°<\alpha\leq70°$.

Similarly, an angle $\beta$ formed between the second curved line 152 and the non-recessed surface of the organic encapsulation layer 132 may be determined according to various application scenarios. In one embodiment, the angle $\beta$ formed between the second curved line 152 and the non-recessed surface of the organic encapsulation layer 132 may be greater than about 0° and smaller than or equal to about 60°, i.e., $0°<\beta\leq60°$. In another embodiment, the angle $\beta$ formed between the second curved line 152 and the non-recessed surface of the organic encapsulation layer 132 may be greater than about 15° and smaller than or equal to about 70°, i.e., $15°<\beta\leq70°$. When the angle $\beta$ formed between the second curved line 152 and the non-recessed surface of the organic encapsulation layer 132 is large, for example, greater than about 70° and smaller than or equal to about 90°, a substantially large bending stress may be generated when the flexible display panel is bent. The bending stress may likely concentrate in the groove 14, thereby causing the groove 14 to crack or break.

When the angle β formed between the second curved line 152 and the non-recessed surface of the organic encapsulation layer 132 is substantially small, the bottom width of the groove 14 may be wide, and the groove 14 may extend into the display area of the flexible display panel, thereby causing the light emitted from the display area to refract and reflect, and degrading the display performance of the flexible display panel. Thus, the angle β formed between the second curved line 152 and the non-recessed surface of the organic encapsulation layer 132 may be configured to be greater than about 15° and smaller than or equal to about 45°, i.e., $15°<β≤45°$.

In the disclosed embodiments, one bending area may include a plurality of grooves. That is, a plurality of grooves may be disposed in the same bending area. When the plurality of the grooves is configured in the same bending area, the plurality of the grooves may be arranged in parallel in a direction perpendicular to an extension direction of the groove. An exemplary structure is shown in FIG. 3B.

Figure 3B:
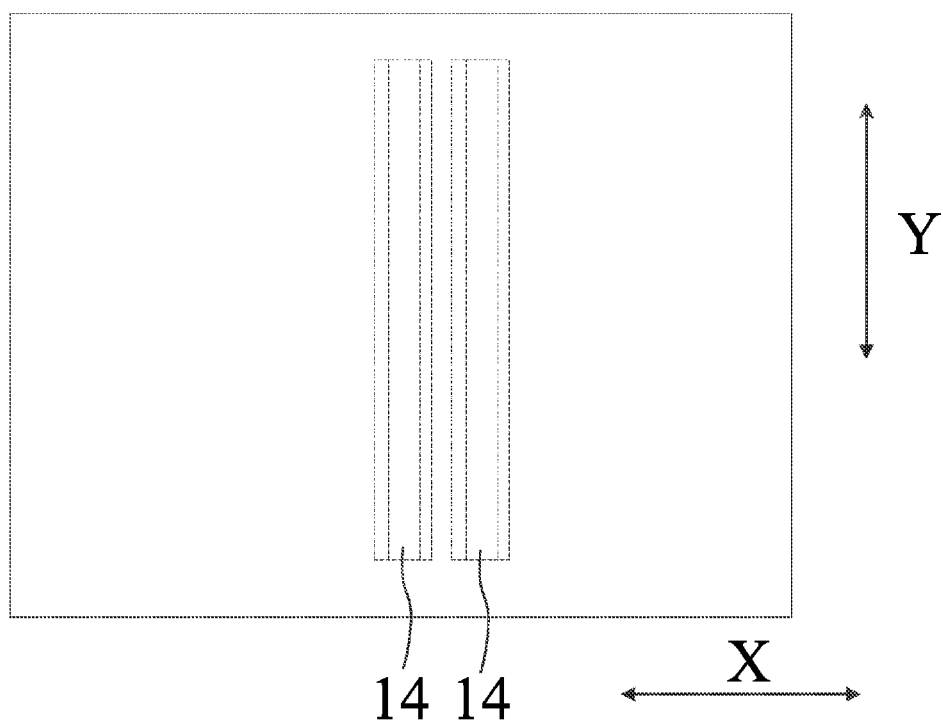
FIG. 3B illustrates a top view of another exemplary flexible display panel according to the disclosed embodiments.

FIG. 3B illustrates a top view of another exemplary flexible display panel according to the disclosed embodiments. As shown in FIG. 3B, one bending area of the flexible display panel may include two grooves 14. The grooves 14 may extend in a direction Y. The two grooves 14 may be arranged in parallel in a direction X. The direction X may be perpendicular to the extension direction Y of grooves 14. The number of the grooves 14, the directions X and Y in FIG. 3B are for illustrative purposes and are not intended to limit the scope of the present disclosure.

The flexible display panel may include a display area and a non-display area surrounding the display area. At least one of the display area and the non-display area may be configured with at least one bending area. The display area may be an area for image display, and the non-display area may be an area not for image display.

Further, the non-display area of the flexible display panel may be disposed with a peripheral circuit. An orthogonal projection of the peripheral circuit onto the flexible substrate may partially overlap with an orthogonal projection of the bending area onto the flexible substrate. An exemplary structure is shown in FIG. 4A.

Figure 4A:
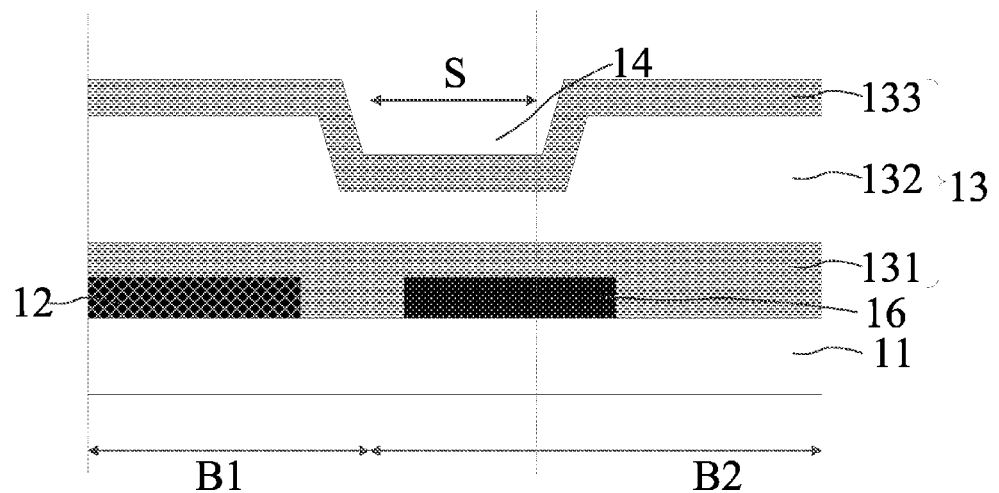
FIG. 4A illustrates a cross-sectional view of another exemplary flexible display panel according to the disclosed embodiments.

FIG. 4A illustrates a cross-sectional view of another exemplary flexible display panel according to the disclosed embodiments. As shown in FIG. 4A, the flexible display panel may include a display area B1 and a non-display area B2. The non-display area B2 of the flexible display panel may be configured with a peripheral circuit 16. An orthogonal projection of the peripheral circuit 16 onto the flexible substrate 11 may partially overlap with an orthogonal projection of the bending area S onto the flexible substrate 11. Thus, the bending area S may not separately occupy the non-display area B2 of the flexible display panel, thereby facilitating a narrow frame design of the flexible display panel.

The peripheral circuit may include thin-film-transistors and metal wirings. That is, the bending area S may bend downwards from the edge of the display area B1, and may be located in the non-display area B2. In various practical applications, after the bending area S is bent, the non-display area B2 may become a side wall of the flexible display panel. When the flexible display panel is incorporated in a display apparatus, the bending area S may be bent, such that the non-display area B2 may become a side wall of the display apparatus, or the non-display area B2 may be folded to the back wall of the display area B1. Thus, a borderless design of the display apparatus may be achieved, and non-display area B2 may be called an edge area or border area.

Figure 4B:
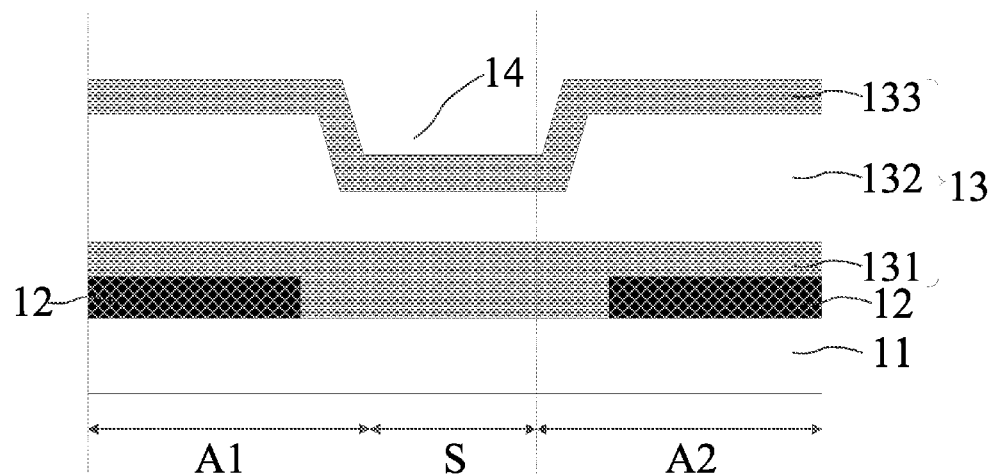
FIG. 4B illustrates a cross-sectional view of another exemplary flexible display panel according to the disclosed embodiments.

FIG. 4B illustrates a cross-sectional view of another exemplary flexible display panel according to the disclosed embodiments. In one embodiment, as shown in FIG. 4B, the flexible display panel may include a flexible substrate 11, an organic light-emitting layer 12 disposed on a side of the flexible substrate 11 and having a first side facing the flexible substrate and an opposing side, and a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132. The first organic encapsulation layer 132 may be disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be configured with at least one groove 14 in the bending area S.

The flexible display panel may also include a display area. The display area may include a first display area A1 and a second display area A2. Both the first display area A1 and the second display area A2 may be located adjacent to the bending area S. The bending area S may be disposed between the first display area A1 and the second display area A2. That is, the bending area S may also be located in the display area. However, the bending area S may be located in a non-light-emitting area of the display area.

In particular, an orthogonal projection of the groove 14 on the organic light-emitting layer 12 may be located between two adjacent rows or two adjacent columns of sub-pixels. That is, in a direction perpendicular to the flexible display panel, the thin-film-encapsulation layer 13 in the area of sub-pixels may not be configured with any groove 14. Thus, the area of sub-pixels in the thin-film-encapsulation layer 13 may be substantially flat, such that the optical properties of the sub-pixels by the groove 14 may not be degraded by the groove 14.

In another embodiment, as shown in FIG. 4B, the flexible display panel may include a flexible substrate 11, an organic light-emitting layer 12 disposed on a side of the flexible substrate 11 having a first side facing the flexible substrate and an opposing side, and a thin-film-encapsulation layer 13 disposed on the opposing side of the organic light-emitting layer 12. The thin-film-encapsulation layer 13 may include a first inorganic encapsulation layer 131, a second inorganic encapsulation layer 133, and a first organic encapsulation layer 132. The first organic encapsulation layer 132 may be disposed between the first inorganic encapsulation layer 131 and the second inorganic encapsulation layer 133. The first inorganic encapsulation layer 131 may be disposed between the organic light-emitting layer 12 and the first organic encapsulation layer 132. The first organic encapsulation layer 132 may be configured with at least one groove 14 in the bending area S.

The flexible display panel may also include a first display area A1 and a second display area A2. The first display area A1 and the second display area A2 may display different images. The bending area S may be disposed between the first display area A1 and the second display area A2. That is, the bending area S may bend downwards from an edge of the first display area A1. The bending area S may be a non-display area. The second display area A2 may be an area extended outward from the bending area S. In various practical applications, when the flexible display panel is incorporated in a display apparatus, the flexible display panel may display different images in the first display area A1 and the second display area A2. Thus, the display apparatus may be a double-sided display apparatus.

Figure 4C:
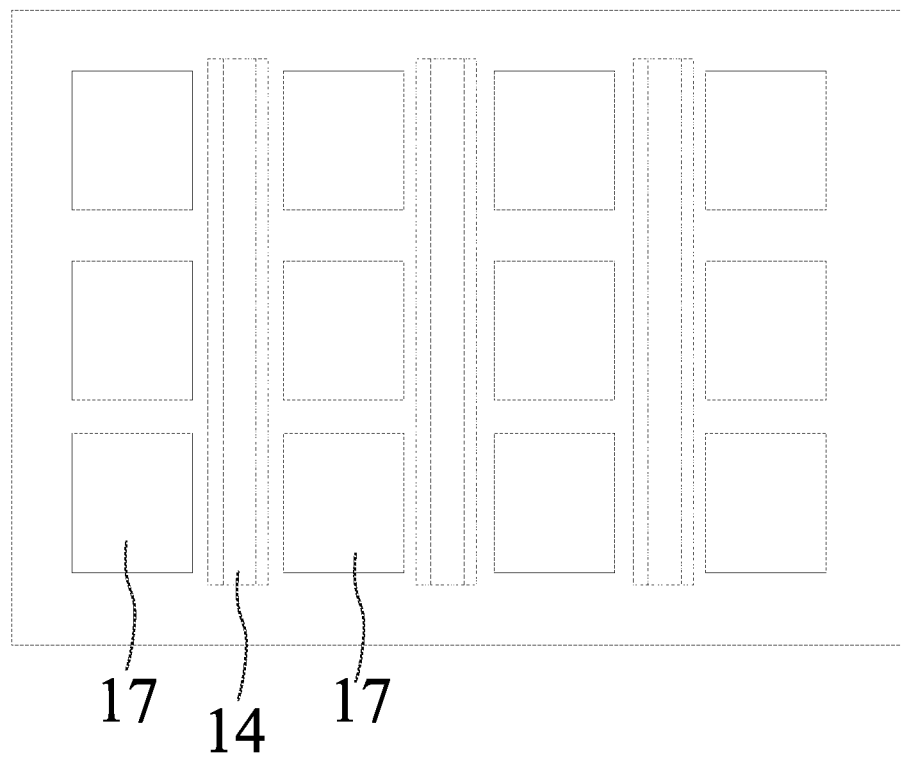
FIG. 4C illustrates a top view of another exemplary flexible display panel according to the disclosed embodiments.

FIG. 4C illustrates a top view of another exemplary flexible display panel according to the disclosed embodiments. As shown in FIG. 4C, a plurality of grooves 14 may be disposed between two adjacent columns of pixels 17. The groove 14 may be arranged in a straight line in an extension direction of the groove 14. That is, the groove 14 may have a straight line shape.

Figure 4D:
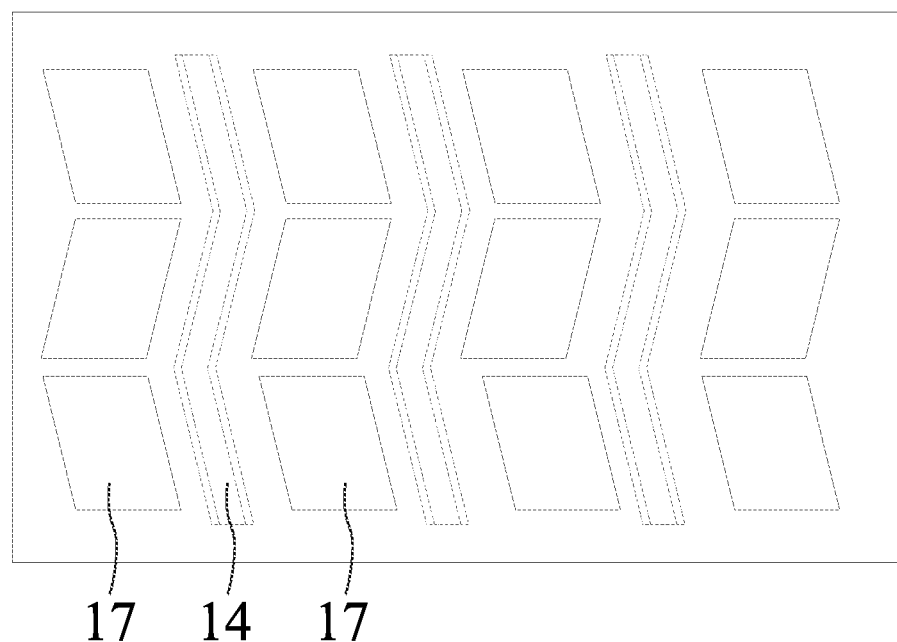
FIG. 4D illustrates a top view of another exemplary flexible display panel according to the disclosed embodiments.

FIG. 4D illustrates a top view of another exemplary flexible display panel according to the disclosed embodiments. As shown in FIG. 4D, a plurality of grooves 14 may be disposed between any two adjacent columns of pixels 17. The groove 14 may be arranged in a folded line in an extension direction of the groove 14. That is, the groove 14 may have a folded line shape.

The arrangement and the shape of the grooves 14 in FIG. 4C and FIG. 4D are for illustrative purposes and are not intended to limit the scope of the present disclosure.

In practical applications, the grooves 14 may be arranged in a way adapting to the shape and arrangement of the pixels.

Figure 5:
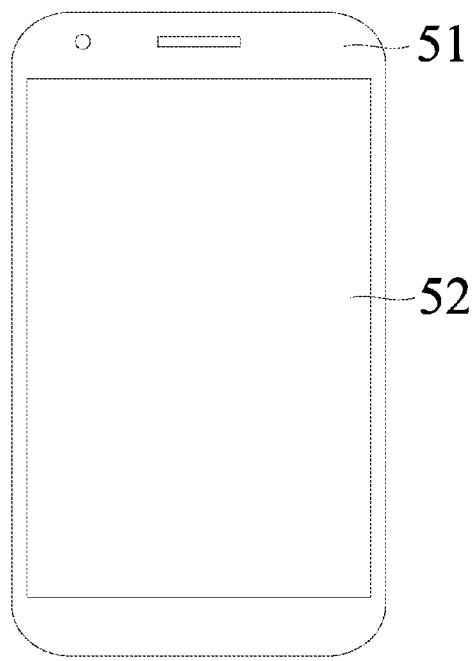
FIG. 5 illustrates a schematic view of an exemplary display apparatus according to the disclosed embodiments.

The present disclosure also provides a display apparatus. The display apparatus may include a disclosed flexible display panel. FIG. 5 illustrates a schematic view of an exemplary display apparatus according to the disclosed embodiments. As shown in FIG. 5, the display apparatus 51 may include a flexible display panel 52. The flexible display panel 52 may be any one of the disclosed flexible display panels. Although a smart phone is shown in FIG. 16, the touch control display apparatus 1 may be a smart watch, a VR goggle, a smart hand band, an electronic paper, a television set, an automotive display, a notebook computer, a tablet computer, or any appropriate touch control display apparatus, which is not limited by the present disclosure.

Figure 6A:
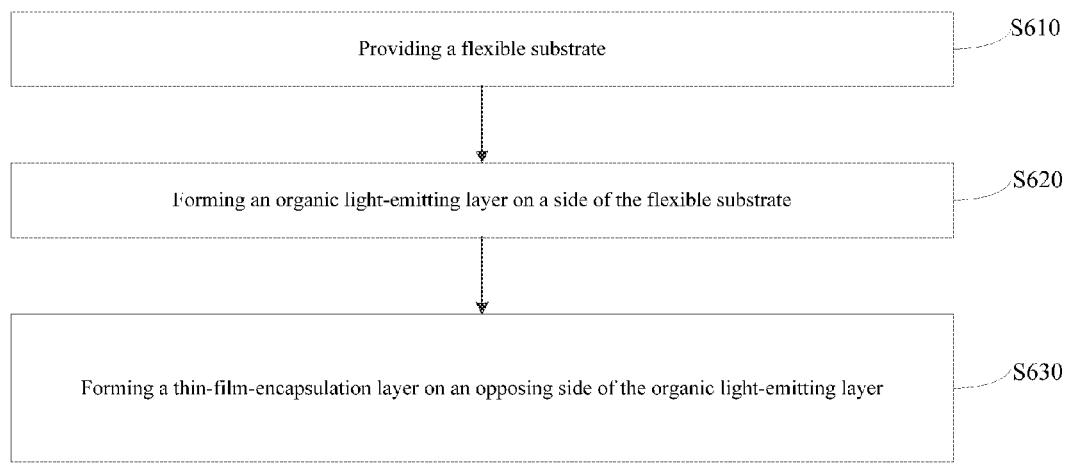
FIG. 6A illustrates a flow chart of an exemplary flexible display panel fabrication method according to the disclosed embodiments.
Figure 6B:
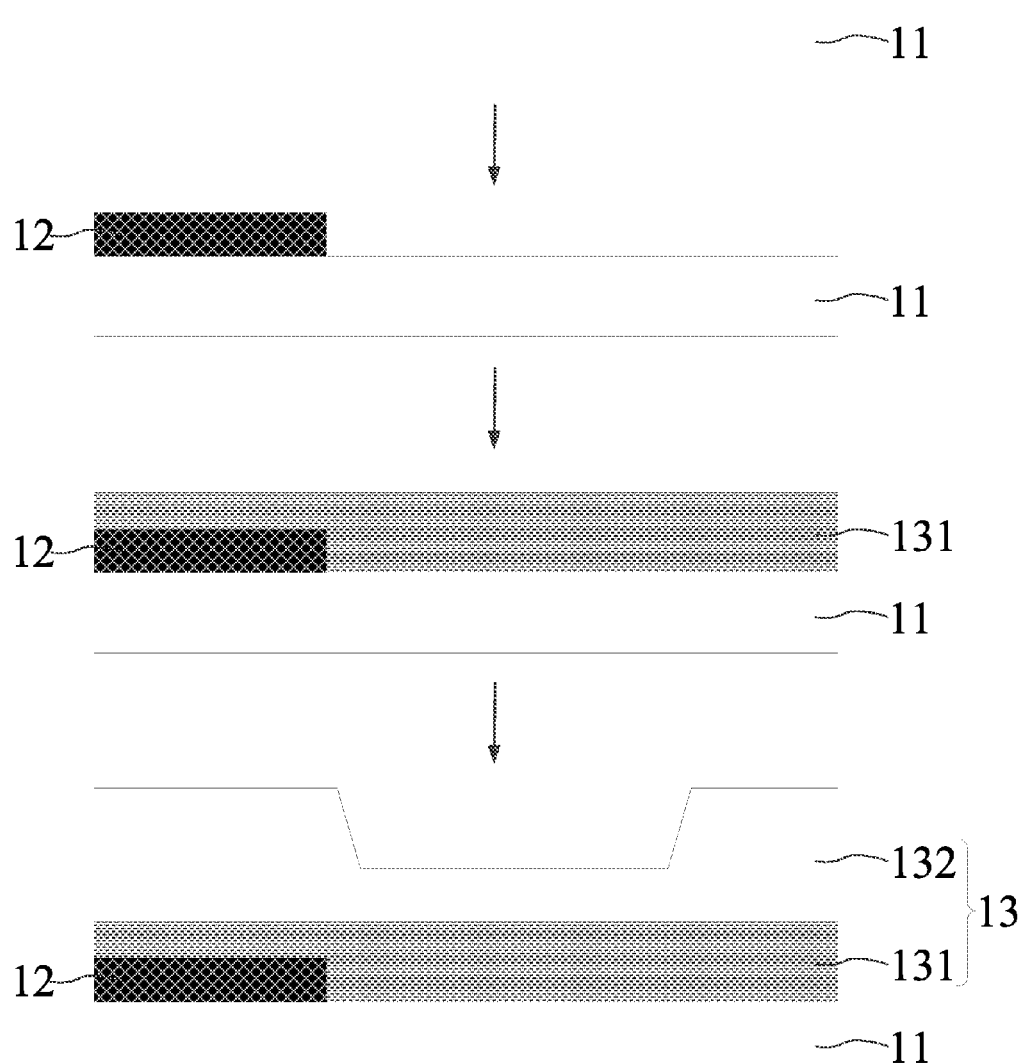
FIG. 6B illustrates cross-sectional views of an exemplary flexible display panel corresponding to each step of an exemplary fabrication method according to the disclosed embodiments.

FIG. 6A illustrates a flow chart of an exemplary fabrication method for an exemplary flexible display panel according to the disclosed embodiments. FIG. 6B illustrates cross-sectional views of an exemplary flexible display panel corresponding to each step of an exemplary fabrication method according to the disclosed embodiments. As shown in FIG. 6A, at the beginning, a flexible substrate is provided (S610). After the flexible substrate is provided, an organic light-emitting layer is formed on the flexible substrate (S620). The corresponding structure is shown in FIG. 6B.

As shown in FIG. 6B, the organic light-emitting layer 12 may be formed by sputtering, vapor deposition, or similarly appropriate processes. In particular, through sputtering or vapor deposition, a first electrode of an organic light-emitting device may be formed in the organic light-emitting layer 12 on the flexible substrate 11. The first electrode may have a first side facing the flexible substrate and an opposing side. After the first electrode is formed, through sputtering or vapor deposition, an organic light-emitting material layer may be formed on the opposing side of the first electrode. The organic light-emitting material layer may have a first side facing the flexible substrate and an opposing side. After the organic light-emitting material layer is formed, through sputtering or vapor deposition, a second electrode may be formed on the opposing side of the organic light-emitting material layer. The first electrode or the second electrode may be a transparent electrode, a semi-transparent electrode, or a reflective electrode.

Returning to FIG. 6A, after the organic light-emitting layer is formed on the flexible substrate, the organic light-emitting layer has a first side facing the flexible substrate and an opposing side, a thin-film-encapsulation layer is formed on the opposing side of the organic light-emitting of the flexible substrate (S630). The corresponding structure is shown in FIG. 6B.

As shown in FIG. 6B, the organic light-emitting layer 12 may have a first side facing the flexible substrate 11 and an opposing side. The thin-film-encapsulation layer 13 may be formed on the opposing side of the organic light-emitting layer 12. The thin-film-encapsulation layer 13 may include at least one organic encapsulation layer 132 and at least one inorganic encapsulation layer 131. The organic encapsulation layer 132 may have a first side facing the flexible substrate 11 and an opposing side. The inorganic encapsulation layer 131 may have a first side facing the flexible substrate 11 and an opposing side. The fabricated flexible display panel may include at least one bending area. At least one groove may be formed on the opposing side of at least one organic encapsulation layer 132 in the bending area.

A bottom width W of the groove may be configured to be $$W \geq \frac{n}{180°}\pi R,$$

where n is a maximum bending angle of the bending area, $0° < n \leq 180°$, and R is a bending radius of the bending area. In one embodiment, the bottom width W of the groove may be configured to be $W = \pi R$.

In the disclosed embodiments, the organic encapsulation layer 132 may formed by an ink jet printing process. The organic encapsulation layer 132 may be formed together with the groove by the same ink jet printing process. The inorganic encapsulation layer 131 may be formed by a chemical vapor deposition (CVD) process or an atomic layer deposition (ALD) process.

Figure 6C:
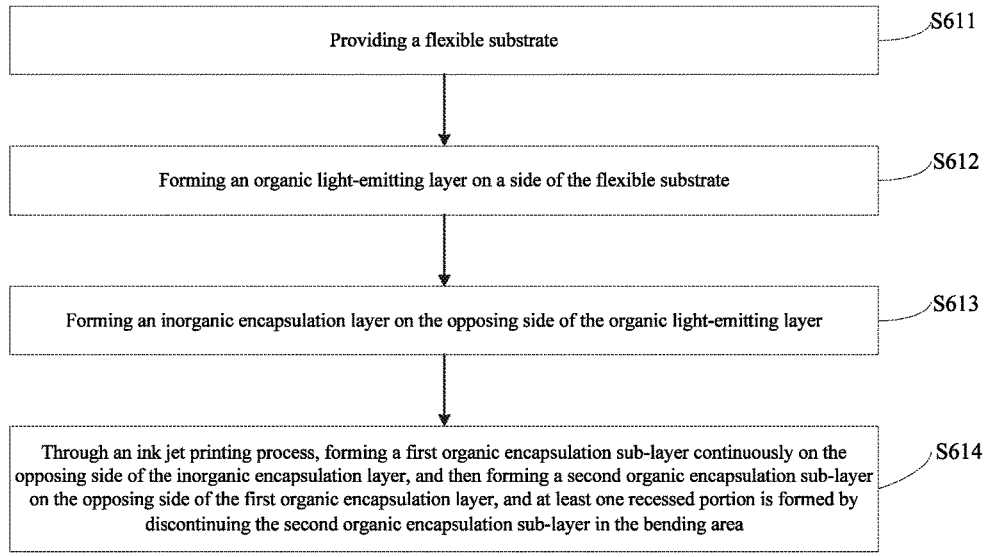
FIG. 6C illustrates a flow chart of another exemplary flexible display panel fabrication method according to the disclosed embodiments.

FIG. 6C illustrates a flow chart of another exemplary fabrication method for an exemplary flexible display panel according to the disclosed embodiments. The corresponding structure is shown in FIG. 6B. The similarities between FIG. 6C and FIG. 6A are not repeated here, while certain differences will be explained.

As shown in FIG. 6C, at the beginning, a flexible substrate is provided (S611). After the flexible substrate is provided, an organic light-emitting layer is formed on a side of the flexible substrate (S612). After the organic light-emitting layer is formed on the flexible substrate, an inorganic encapsulation layer is formed on the opposing side of the organic light-emitting layer (S613). After the inorganic encapsulation layer is formed on the organic light-emitting layer, through ink jet printing, a first organic encapsulation sub-layer is formed continuously on the opposing side of the inorganic encapsulation layer, and then a second organic encapsulation sub-layer is formed on the opposing side of the first organic encapsulation layer, and at least one groove is formed by discontinuing the second organic encapsulation sub-layer in the bending area (S614).

The inorganic encapsulation layer may be disposed between the organic light-emitting layer and the first organic encapsulation sub-layer.

Figure 6D:
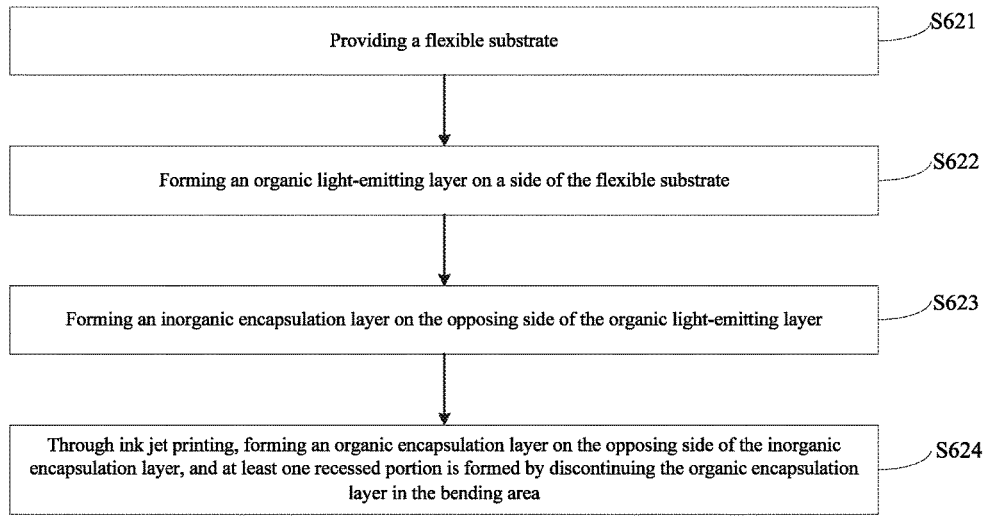
FIG. 6D illustrates a flow chart of another exemplary flexible display panel fabrication method according to the disclosed embodiments.

FIG. 6D illustrates a flow chart of another exemplary fabrication method for an exemplary flexible display panel according to the disclosed embodiments. The corresponding structure is shown in FIG. 6B. The similarities between FIG. 6D and FIG. 6A are not repeated here, while certain differences will be explained.

As shown in FIG. 6D, at the beginning, a flexible substrate is provided (S621). After the flexible substrate is provided, an organic light-emitting layer is formed on a side of the flexible substrate (S622). After the organic light-emitting layer is formed on the flexible substrate, an inorganic encapsulation layer is formed on opposing side of the organic light-emitting layer (S623). After the inorganic encapsulation layer is formed on the organic light-emitting layer, through ink jet printing, an organic encapsulation layer is formed on the opposing side of the inorganic encapsulation layer, and at least one groove is formed by discontinuing the organic encapsulation layer in the bending area (S624).

The inorganic encapsulation layer may be disposed between the organic light-emitting layer and the organic encapsulation layer. Through ink jet printing, the organic encapsulation layer and at least one groove may be formed at the same time.

The present disclosure provides an improved flexible display panel. The flexible display panel may comprise a flexible substrate, an organic light-emitting layer disposed on a side of the flexible substrate and having a first side facing the flexible substrate and an opposing side, and a thin-film-encapsulation layer disposed on the opposing side of the organic light-emitting layer. The thin-film-encapsulation layer may include at least one organic encapsulation layer and at least one inorganic encapsulation layer. The organic encapsulation layer may have a first side facing the organic light-emitting layer and an opposing side. The flexible display panel may include at least one bending area, where at least one groove may be formed on the opposing side of at least one organic encapsulation layer. A width W at the bottom (i.e., the bottom width) of the groove may be configured to be $$W \geq \frac{n}{180°}\pi R,$$

where n is a maximum bending angle of the bending area, 0°<n≤180°, and R is a bending radius of the bending area.

It should be noted that the various embodiments in the present specification are described in a progressive manner. Each embodiment is mainly described in terms of differences from the previously described embodiments. The similarities between different embodiments are not repeated, and may be incorporated by references.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A flexible display panel, comprising:
   a flexible substrate;
   an organic light-emitting layer disposed on a side of the flexible substrate and having a first side facing the flexible substrate and an opposing side; and
   a thin-film-encapsulation layer disposed on the opposing side of the organic light-emitting layer and including at least one organic encapsulation layer and at least one inorganic encapsulation layer,
   wherein:
   the flexible display panel includes at least one bending area;
   the at least one organic encapsulation layer has a first side facing the flexible substrate and an opposing side;
   the at least one inorganic encapsulation layer has a first side facing the flexible substrate and an opposing side;
   in the at least one bending area, at least one groove is formed on the opposing side of the at least one organic encapsulation layer; and
   a bottom width W of the at least one groove is configured to be W≥πR, where R is a bending radius of the at least one bending area.

2. The flexible display panel according to claim 1, wherein:
   the bending radius R is greater than or equal to about 0.1 mm.

3. The flexible display panel according to claim 1, wherein:
   the at least one organic encapsulation layer includes a first organic encapsulation sub-layer and a second organic encapsulation sub-layer;
   the first organic encapsulation sub-layer is configured continuously;
   the second organic encapsulation sub-layer is discontinued in the at least one bending area to form the at least one groove; and
   the second organic encapsulation sub-layer is configured on the opposing side of the first organic encapsulation sub-layer.

4. The flexible display panel according to claim 1, wherein:
   the at least one organic encapsulation layer is formed by an ink jet printing process.

5. The flexible display panel according to claim 1, wherein:
   the thin-film-encapsulation layer includes a first inorganic encapsulation layer, a second inorganic encapsulation layer, and a first organic encapsulation layer,
   wherein the first organic encapsulation layer is disposed between the first inorganic encapsulation layer and the second inorganic encapsulation layer;
   the first inorganic encapsulation layer is disposed between the organic light-emitting layer and the first organic encapsulation layer; and
   in the at least one bending area, the at least one groove is formed on the first organic encapsulation layer.

6. The flexible display panel according to claim 1, wherein:
   the thin-film-encapsulation layer includes a first inorganic encapsulation layer, a first organic encapsulation layer, a second inorganic encapsulation layer, a second organic encapsulation layer, and a third inorganic encapsulation layer, which are configured sequentially on the opposing side of the organic light-emitting layer; and
   in the at least one bending area, the at least one groove is formed in either the first organic encapsulation layer or the second organic encapsulation layer.

7. The flexible display panel according to claim 1, wherein:

the at least one organic encapsulation layer is configured with the at least one groove and has a thickness of approximately between 2 μm and 40 μm; and the at least one groove has a thickness of approximately between 1 μm and 20 μm.

8. The flexible display panel according to claim 1, comprising at least one of the following:

a bottom of the at least one groove transitions to a side wall of the at least one groove through a first curved line; and the side wall of the at least one groove transitions to a non-recessed surface of the at least one organic encapsulation layer through a second curved line.

9. The flexible display panel according to claim 8, wherein:

an angle α between the first curved line and the bottom of the at least one groove is approximately in a range of $0°<α≤70°$.

10. The flexible display panel according to claim 9, wherein:

an angle β between the second curved line and the non-recessed surface of the at least one organic encapsulation layer is approximately in a range of $0°<β≤60°$.

11. The flexible display panel according to claim 8, wherein:

an angle α between the first curved line and the bottom of the at least one groove is approximately in a range of $15°<α≤70°$.

12. The flexible display panel according to claim 11, wherein:

an angle β between the second curved line and the non-recessed surface of the at least one organic encapsulation layer is approximately in a range of $15°<β≤45°$.

13. The flexible display panel according to claim 1, wherein:

the at least one bending area includes a plurality of grooves; and the plurality of the grooves is arranged in parallel in a direction perpendicular to an extension direction of a groove.

14. The flexible display panel according to claim 1, wherein:

the at least one organic encapsulation layer is made of acrylic, epoxy, or silicone materials.

15. The flexible display panel according to claim 1, wherein:

the flexible display panel includes a display area and a non-display area surrounding the display area; and at least one of the display area and the non-display area is configured with the at least one bending area.

16. The flexible display panel according to claim 15, wherein:

a peripheral circuit is configured in the non-display area; and the peripheral circuit at least partially overlaps with the at least one bending area in a direction perpendicular to the flexible substrate.

17. The flexible display panel according to claim 15, wherein:

the display area includes two sections; and the at least one bending area is disposed between the two sections of the display area.

18. The flexible display panel according to claim 17, wherein:

the display area includes two sections for displaying different images; and the at least one bending area is disposed between the two sections of the display area.

19. The flexible display panel according to claim 15, wherein:

an orthogonal projection of the at least one groove onto the organic light-emitting layer is located between two rows or two columns of sub-pixels.

20. The flexible display panel according to claim 15, wherein:

the flexible display panel includes a plurality of bending areas; and a plurality of grooves in the plurality of the bending areas are arranged in parallel.

21. The flexible display panel according to claim 15, wherein:

the at least one groove is arranged in a straight line or a folded line in an extension direction of the at least one groove.

22. A flexible display apparatus, comprising a flexible display panel, wherein the flexible display panel comprises:

a flexible substrate;

an organic light-emitting layer disposed on a side of the flexible substrate and having a first side facing the flexible substrate and an opposing side; and a thin-film-encapsulation layer disposed on the opposing side of the organic light-emitting layer and including at least one organic encapsulation layer and at least one inorganic encapsulation layer, wherein:

the flexible display panel includes at least one bending area;

the at least one organic encapsulation layer has a first side facing the flexible substrate and an opposing side;

the at least one inorganic encapsulation layer has a first side facing the flexible substrate and an opposing side;

in the at least one bending area, at least one groove is formed on the opposing side of the at least one organic encapsulation layer; and a bottom width W of the at least one groove is configured to be $W≥πR$, where R is a bending radius of the at least one bending area.

23. A fabrication method for a flexible display panel, comprising:

providing a flexible substrate;

forming an organic light-emitting layer having a first side facing the flexible substrate and an opposing side on a side of the flexible substrate; and forming a thin-film-encapsulation layer on the opposing side of the organic light-emitting layer, wherein:

the thin-film-encapsulation layer includes at least one organic encapsulation layer and at least one inorganic encapsulation layer;

the flexible display panel includes at least one bending area;

at least one groove is formed on the opposing side of the at least one organic encapsulation layer in the at least one bending area; and a bottom width W of the at least one groove is configured to be $W≥πR$, where R is a bending radius of the at least one bending area.

24. The fabrication method according to claim 23, wherein:

the at least one organic encapsulation layer is formed by an ink jet printing process.

25. The fabrication method according to claim 24, wherein forming the at least one organic encapsulation layer includes:
- through an ink jet printing process, forming a continuous first organic encapsulation sub-layer having a first side facing the flexible substrate and an opposing side;
- through the ink jet printing process, forming a second organic encapsulation sub-layer on the opposing side of the first organic encapsulation sub-layer; and
- forming the at least one groove by discontinuing the second organic encapsulation sub-layer in the at least one bending area.

26. The fabrication method according to claim 23, wherein forming the at least one organic encapsulation layer includes:
- through an ink jet printing process, forming the at least one organic encapsulation layer;
- discontinuing the at least one organic encapsulation layer in the at least one bending area to form the at least one groove.

* * * * *